US011101141B2

(12) United States Patent
Chang et al.

(10) Patent No.: US 11,101,141 B2
(45) Date of Patent: Aug. 24, 2021

(54) METHOD FOR REDUCING DEFECTS OF ELECTRONIC COMPONENTS BY A SUPERCRITICAL FLUID

(71) Applicant: NATIONAL SUN YAT-SEN UNIVERSITY, Kaohsiung (TW)

(72) Inventors: Ting-Chang Chang, Kaohsiung (TW); Kuan-Chang Chang, Kaohsiung (TW); Chih-Cheng Shih, Kaohsiung (TW); Chih-Hung Pan, Kaohsiung (TW)

(73) Assignee: NATIONAL SUN YAT-SEN UNIVERSITY KZ, Kaohsiung (TW)

( * ) Notice: Subject to any disclaimer, the term of this patent is extended or adjusted under 35 U.S.C. 154(b) by 98 days.

(21) Appl. No.: 16/511,396

(22) Filed: Jul. 15, 2019

(65) Prior Publication Data

US 2019/0341267 A1 Nov. 7, 2019

Related U.S. Application Data

(63) Continuation-in-part of application No. 15/712,772, filed on Sep. 22, 2017, now abandoned.

(30) Foreign Application Priority Data

Jan. 12, 2017 (TW) .................................. 106101012

(51) Int. Cl.
*H01L 21/322* (2006.01)
*H01L 21/26* (2006.01)

(52) U.S. Cl.
CPC ............ *H01L 21/322* (2013.01); *H01L 21/26* (2013.01)

(58) Field of Classification Search
CPC ...... H01L 21/045; H01L 21/26; H01L 21/322; H01L 21/3228; H01L 29/1608; H01L 29/2003; H01L 29/66068; H01L 29/66734; H01L 29/7813; H01L 31/1872; H01L 33/0095; Y02E 10/50; Y02P 70/50
See application file for complete search history.

(56) References Cited

U.S. PATENT DOCUMENTS

| | | | |
|---|---|---|---|
| 6,024,801 A | * | 2/2000 | Wallace .................... B08B 7/00 134/1 |
| 6,376,531 B1 | | 4/2002 | Bell |
| 6,875,286 B2 | | 4/2005 | Cotte et al. |
| 7,485,611 B2 | | 2/2009 | Roeder et al. |
| 7,973,188 B2 | | 7/2011 | Thompson |
| 8,373,271 B2 | | 2/2013 | Goldfarb et al. |
| 2004/0112406 A1 | * | 6/2004 | Cotte ................ H01L 21/02063 134/4 |

(Continued)

FOREIGN PATENT DOCUMENTS

| | | |
|---|---|---|
| CN | 1779920 A | 5/2006 |
| CN | 1016210001 A | 1/2010 |

(Continued)

*Primary Examiner* — Hua Qi
(74) *Attorney, Agent, or Firm* — WPAT, PC

(57) ABSTRACT

A method for reducing defects of an electronic component using a supercritical fluid includes recrystallizing and rearranging grains in the electronic component by introducing the supercritical fluid doped with $H_2S$ together with an electromagnetic wave into a cavity. The cavity has a temperature above a critical temperature of the supercritical fluid and a pressure above a critical pressure of the supercritical fluid.

3 Claims, 6 Drawing Sheets

(56) References Cited

U.S. PATENT DOCUMENTS

| | | | |
|---|---|---|---|
| 2004/0255984 A1 | 12/2004 | Banerjee et al. | |
| 2005/0217706 A1 | 10/2005 | Banerjee et al. | |
| 2006/0037530 A1* | 2/2006 | Dwilinski | C30B 29/406 |
| | | | 117/70 |
| 2006/0096521 A1 | 5/2006 | D'Evelyn et al. | |

FOREIGN PATENT DOCUMENTS

| | | |
|---|---|---|
| TW | 200418583 A | 10/2004 |
| TW | 200426928 A | 12/2004 |
| TW | 200500457 A | 1/2005 |
| TW | 200700425 A | 1/2007 |
| TW | 201207995 A | 2/2012 |

* cited by examiner

METHOD FOR REDUCING DEFECTS OF ELECTRONIC COMPONENTS BY A SUPERCRITICAL FLUID

CROSS REFERENCE TO RELATED APPLICATIONS

This is a continuation-in-part application of U.S. patent application Ser. No. 15/712,772 filed on Sep. 22, 2017, and claims the benefit of Taiwan application serial No. 106101012, filed on Jan. 12, 2017, the entire contents of which are incorporated herein by reference.

BACKGROUND OF THE INVENTION

1. Field of the Invention

The present invention relates to a method for reducing defects of electronic components and, more particularly, to a method for reducing defects of electronic components using a supercritical fluid.

2. Description of the Related Art

As the semiconductor technology becomes more and more sophisticated, electronic components with difference functions can be gradually developed. The electronic components with different functions can be used to form circuits with different functions and therefore can be used in different electronic devices.

In the manufacturing process of the electron components, the raw material could undergo several procedures such as growth, lithography and etching. However, the growth procedure will inevitably lead to defects, resulting in poor performance of the electronic components. To overcome this problem, in the conventional method for improving the performance of the electronic components, the workers start from improving the yield of the growth procedure to increase the performance of the electronic components.

Despite the methods for manufacturing the electronic components are continuously improved, the workers cannot guarantee the growth procedure is perfect. Thus, the improvement of the performance of the manufactured electronic components is still limited. Moreover, the improvement of the performance of the manufactured electronic components will be limited by the requisite conditions such as temperature or pressure in the method for manufacturing the electronic components, leading to unsatisfactory results.

In light of the inconvenience, the conventional method should therefore be improved to enhance the practicality thereof.

SUMMARY OF THE INVENTION

It is therefore an objective of the present invention to provide a method for reducing defects of electronic components using a supercritical fluid. Without changing the original procedure, the electronic components can be modified, improving the performance of the electronic components.

One embodiment of the present invention discloses a method for reducing defects of an electronic component using a supercritical fluid, including: recrystallizing and rearranging grains in the electronic component by introducing the supercritical fluid doped with $H_2S$ together with an electromagnetic wave into a cavity. The cavity has a temperature above a critical temperature of the supercritical fluid and a pressure above a critical pressure of the supercritical fluid.

In an example, the cavity has the temperature of 77-1000 K.

In an example, the cavity has the pressure of 3-1000 atm.

Accordingly, the method for reducing defects of an electronic component using a supercritical fluid according to the present invention can be used to modify the defects of the electronic components, reducing the interfacial defects and the internal defects. The performance loss due to the defects can be further reduced (such as reducing power consumption, etc.). Therefore, by the method for reducing defects of an electronic component using a supercritical fluid according to the present invention, the efficiency of electrical conversion can be improved, and the performance of the electronic components can be enhanced.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Figure 1:
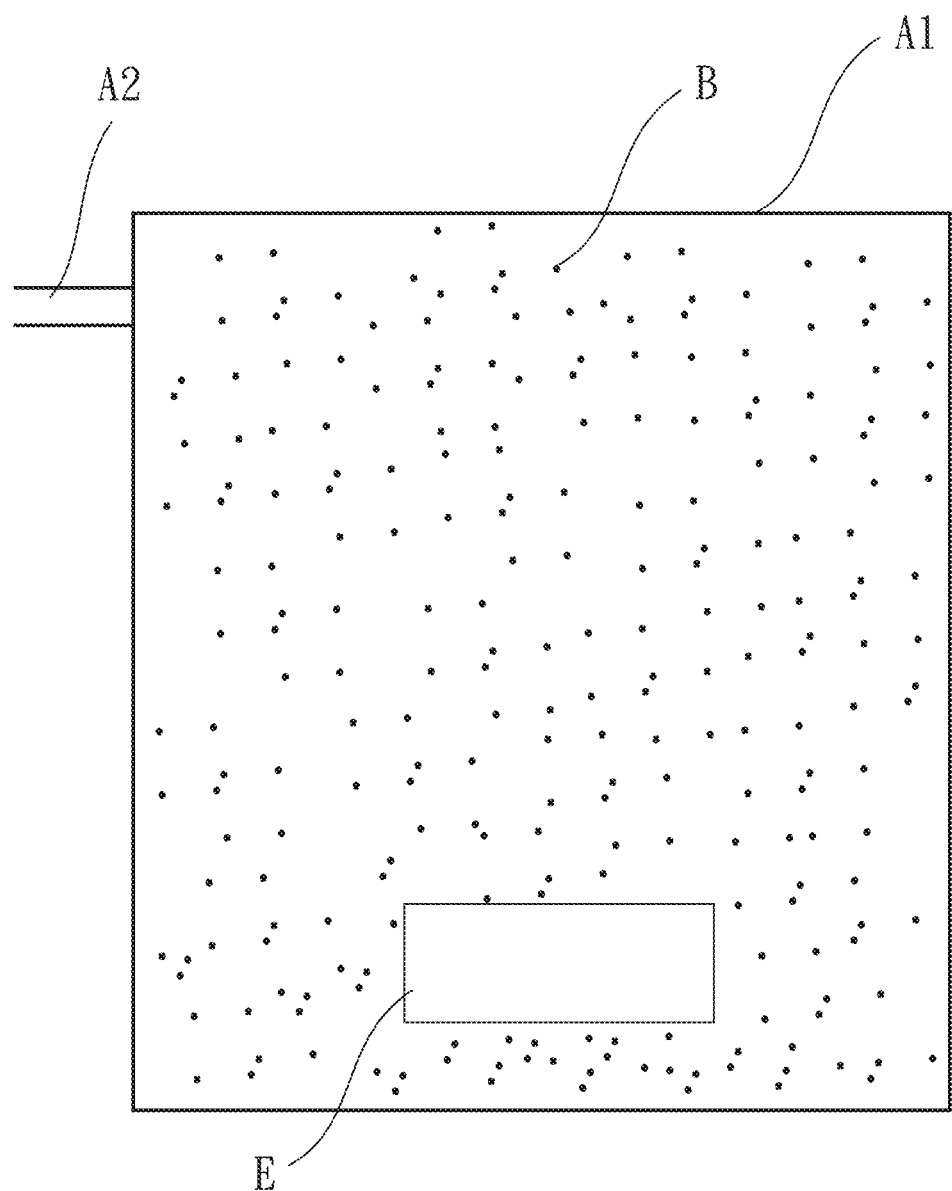
FIG. 1 is a schematic diagram of a method for reducing defects of an electronic component using a supercritical fluid according to the present invention.

FIG. 1 shows a schematic diagram of a method for reducing defects of an electronic component using a supercritical fluid B according to the present invention. The supercritical fluid B can be introduced into a cavity A1 through a fluid access hole A2. The supercritical fluid B used for modifying an electronic component E can be selected to be, but not limited to, carbon dioxide ($CO_2$), water ($H_2O$), freon, etc. The critical temperature and critical pressure of carbon dioxide are 31° C. and 72.8 atm, respectively. Therefore, the supercritical carbon dioxide can be formed by pressurization of carbon dioxide at the standard laboratory temperature. Moreover, the critical temperature and critical pressure of water are 374° C. and 218.3 atm, respectively. The supercritical water is a strong oxidizing agent with a high penetrability for modifying at least one electronic component E.

The electronic component E can be a finished electronic component or a semi-finished electronic component. As an example, the electronic component E can be selected from, but not limited to, a light-emitting component (such as LED or laser), a photovoltaic component (such as a solar cell), an energy-storing component (such as a battery), a sensing component (such as a gas sensor, a light sensor or a pressure sensor), a passive component (such as a resistor, a capacitor or an inductor), a micro-electromechanical component (such as an accelerometer or a gyroscope), a memory component (such as a resistive random access memory), a thin-film transistor component, a high-power electronic component (such as a high withstand voltage transistor) or an electronic element containing an organic compound (such as an organic thin-film transistor or an organic light-emitting diode). The structure of the electronic component E and the position where defects occur in the electronic component E can be appreciated by a person having ordinary skill in the art. Therefore, detail description is not given to avoid redundancy.

In this embodiment, as shown in FIG. 1, the supercritical fluid B (such as $SCCO_2$) can be introduced into the cavity A1. The supercritical fluid B can be doped with a hydrogen isotope-labeled compound as a co-solvent. The hydrogen isotope can be a non-radioactive isotope, such as protium or deuterium. As an example, the hydrogen isotope-labeled compound can be selected from the group consisting of $LiH$, $NaH$, $KH$, $CaH_2$, $MgH_2$, $BeH_2$, $PH_3$, $B_nH_m$, $C_xH_y$, $HF$, $AsH_3$, $NH_3$, $AlH_3$, $H_2S$, $H_2Se$, $HCl$, $HBr$, $HI$, $NH_4Cl$ and $CO(NH_2)_2$. The percentage of the hydrogen isotope-labeled compound can be adjusted according to the requirement. In an alternative example, the supercritical fluid B can be doped with an organic metal compound as a co-solvent. The organic metal compound can be formed, but not to be limited to, from a precursor such as a precursor formed from a chemical reaction. In another alternative example, the supercritical fluid B can be doped with either an element or a compound containing the element as a co-solvent. The element is selected from a halogen element, oxygen (O), sulfur (S), selenium (Se), phosphorus (P) or arsenic (As). The halogen can be fluorine (F), chlorine (Cl), bromine (Br) or iodine (I). In this embodiment, the co-solvent is selected as the hydrogen isotope-labeled compound. Moreover, at least one electronic component E in the cavity A1 is modified by the supercritical fluid B at a temperature above a critical temperature of the supercritical fluid and a pressure above a critical pressure of the supercritical fluid B. As an example, the electronic component E can be modified by the supercritical fluid B at the temperature of 77-1000 K and the pressure of 3-1000 atm.

The characteristics such as density, diffusivity and viscosity of the supercritical phase are between the characteristics of the liquid phase and the gas phase. Therefore, compared to high penetrability and zero solubility of the gas phase and to low penetrability and high solubility of the liquid phase, the supercritical phase (supercritical fluid) possesses both high penetrability and high solubility. Thus, the supercritical fluid B can be used to remove the defects in the material layer of the electronic component E, to improve the defects in the interface and to modify the thin-layer membrane (such as the change in K value). At the same time, an electromagnetic wave can also be used to improve the modification efficiency. As an example, the electromagnetic wave can also be introduced into the cavity A1, the at least one electronic component E in the cavity A1 is modified by the supercritical fluid B together with the electromagnetic wave. The specific way to modify the electronic component E in the cavity A1 can be appreciated by a person having ordinary skill in the art. Therefore, detail description is not given to avoid redundancy.

Accordingly, after being modified by the supercritical fluid B, the electronic component E can be used in a state without defects or with a few detects. Therefore, compared to an electronic component without modification by the supercritical fluid B, the electronic component E modified by the method according to the present invention has improved work efficiency. In a non-restrictive example, the performance difference of different electronic components E before and after modification by the supercritical fluid B is represented by the characteristic curves of the electronic components E.

Figure 2A:
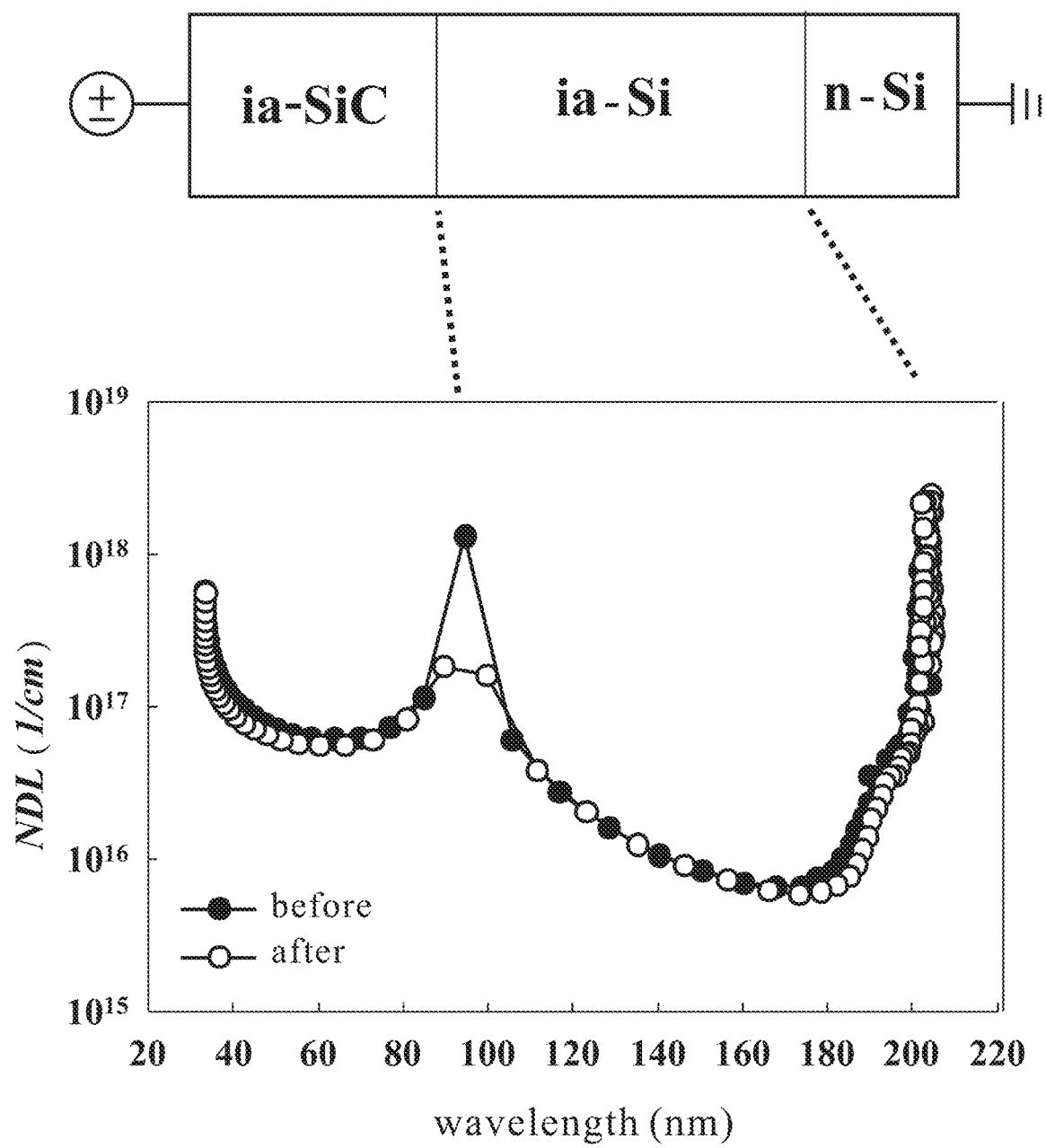
FIG. 2a is a curve diagram showing the defect density of an electronic component according to the present invention in the form of an $\alpha$-SiC/$\alpha$-Si solar cell.
Figure 2B:
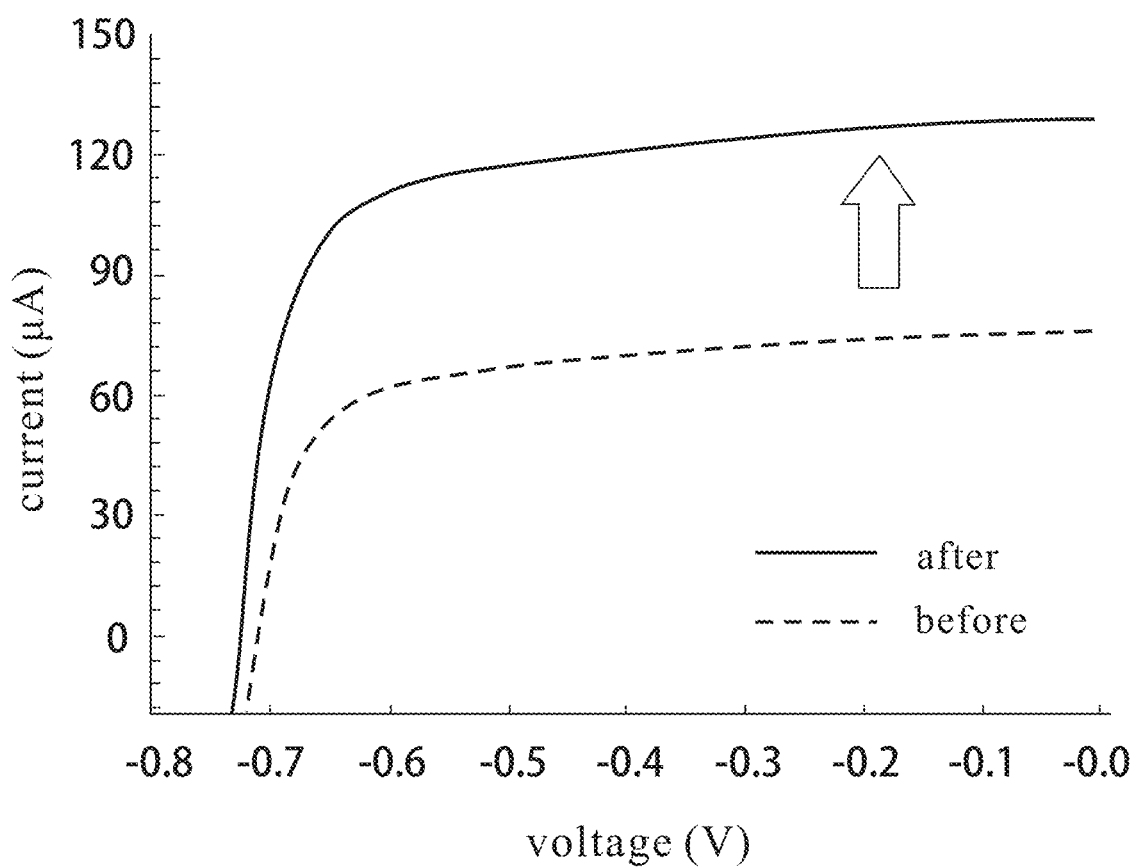
FIG. 2b is a curve diagram showing the output current of the electronic component according to the present invention in the form of the $\alpha$-SiC/$\alpha$-Si solar cell before and after the treatment by the supercritical fluid.

Referring to FIGS. 2*a* and 2*b*, after being modified by the supercritical fluid B, the defect density of the α-SiC/α-Si solar cell significantly decreases, and the output current of the α-SiC/α-Si solar cell greatly increases.

Figure 3A:
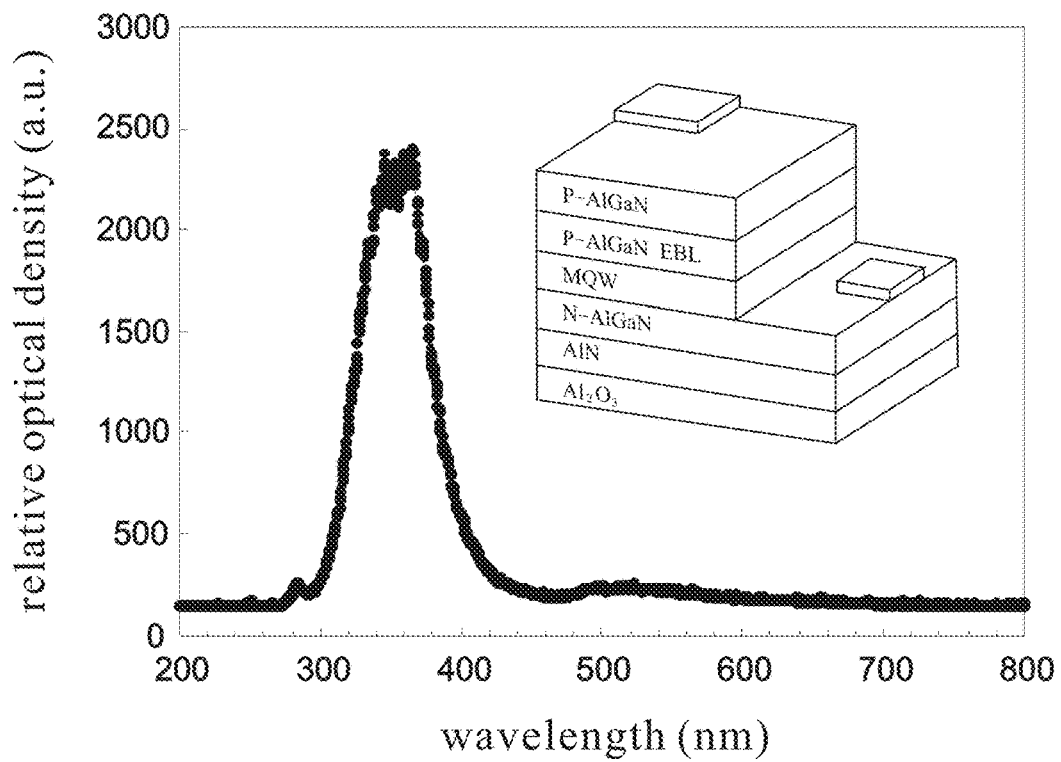
FIG. 3a is an electric curve diagram of the electronic component according to the present invention in the form of an AlGaN UV-C light emitting diodes ($\lambda$=280 nm) before the treatment by the supercritical fluid.
Figure 3B:
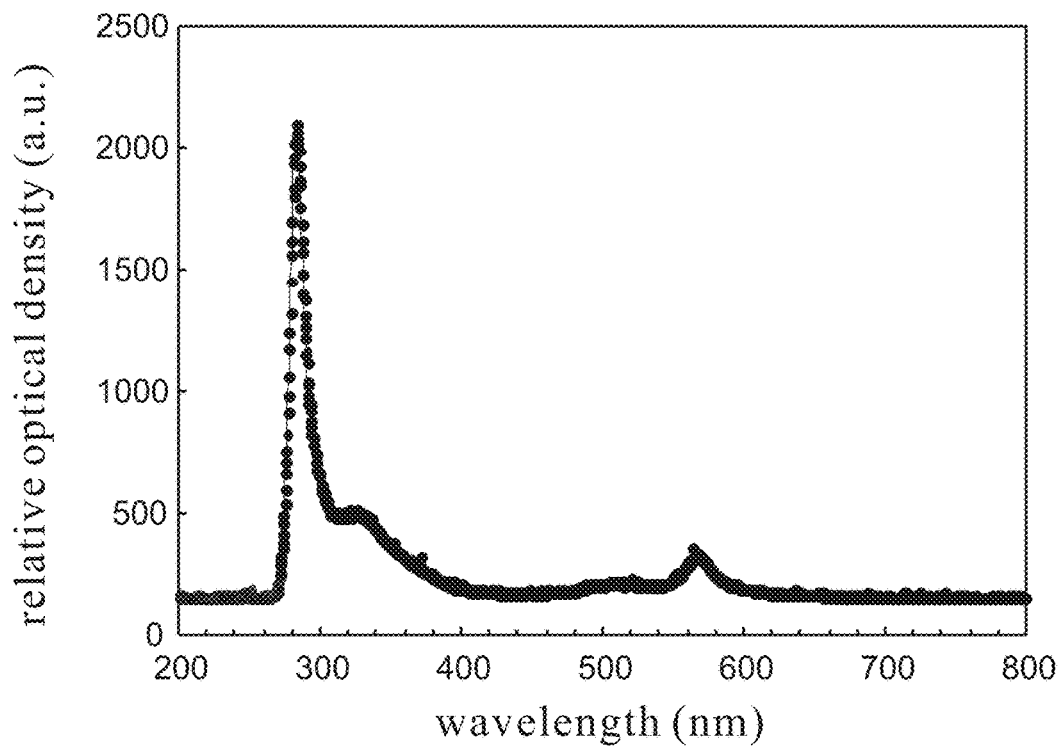
FIG. 3b is an electric curve diagram of the electronic component according to the present invention in the form of the AlGaN UV-C light emitting diodes ($\lambda$=280 nm) after the treatment by the supercritical fluid.

Referring to FIGS. 3*a* and 3*b*, after being modified by the supercritical fluid B, the relative optical density of the AlGaN UV-C light emitting diode is more concentrated at 280 nm in the UV-C range.

Figure 4A:
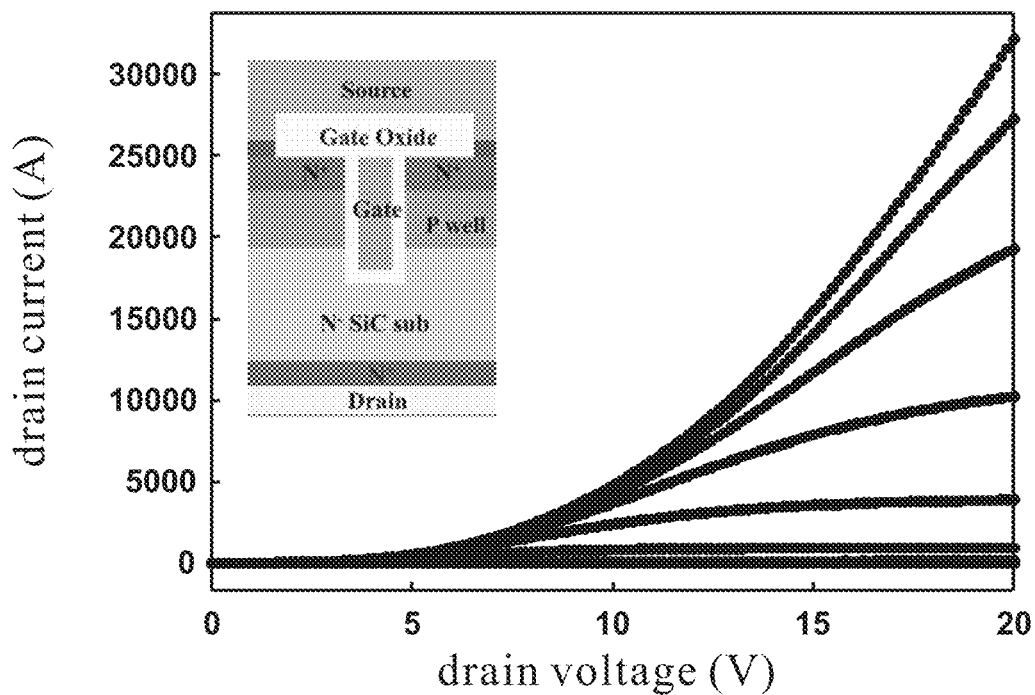
FIG. 4a is an electric curve diagram of the electronic component according to the present invention in the form of a SiC MOSFET high-power electronic component before the treatment by the supercritical fluid.
Figure 4B:
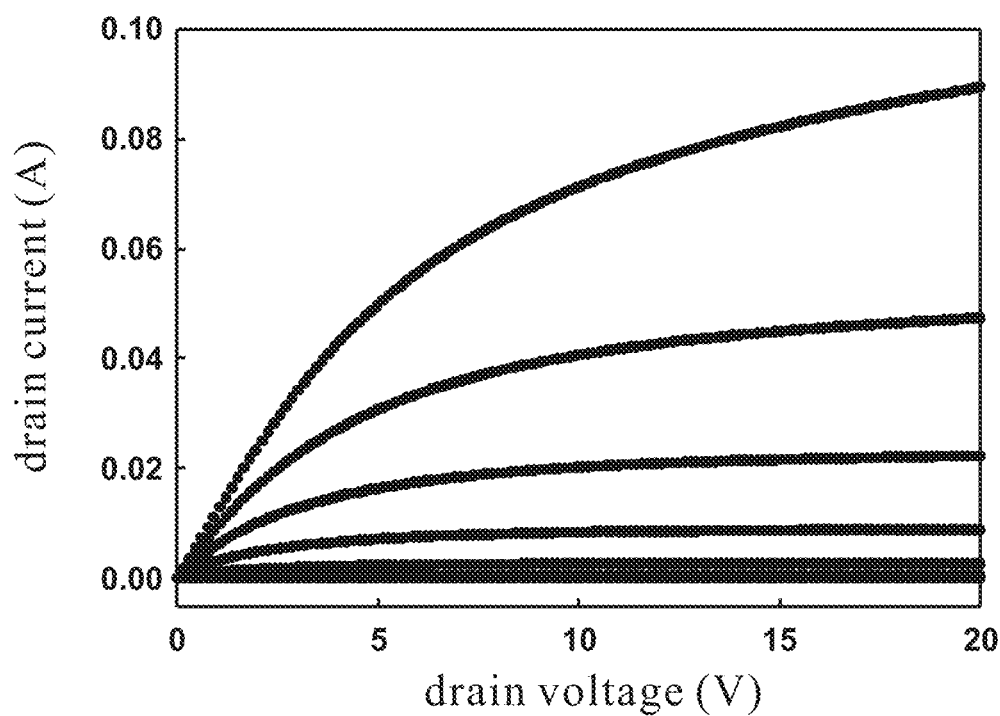
FIG. 4b is an electric curve diagram of the electronic component according to the present invention in the form of the SiC MOSFET high-power electronic component after the treatment by the supercritical fluid.

Referring to FIGS. 4*a* and 4*b*, after being modified by the supercritical fluid B, the relationship between the drain voltage and the current of the SiC MOSFET high-power electronic component significantly changes.

Figure 5:
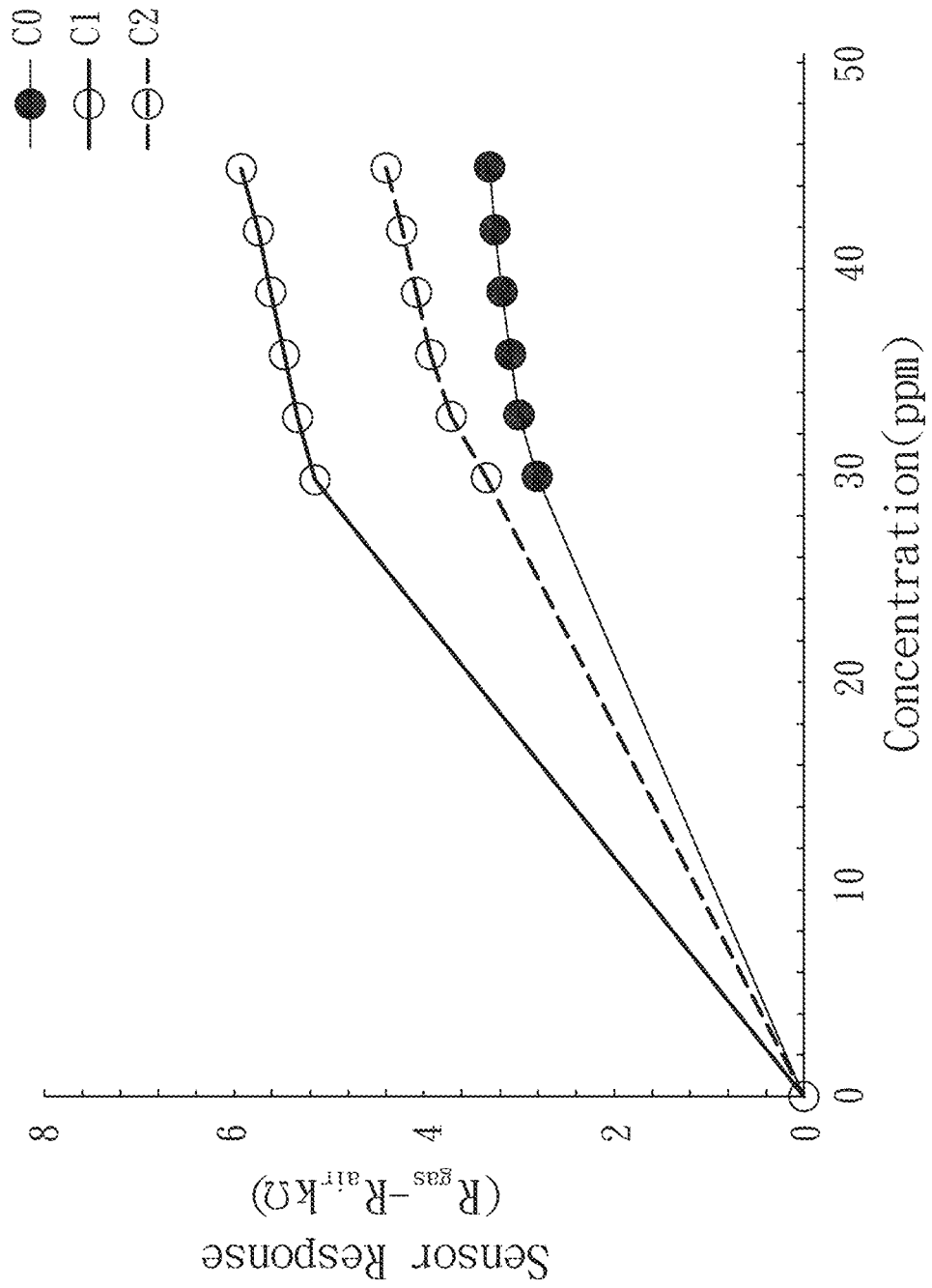
FIG. 5 is a sensor response curve diagram of the gas sensor after the treatment by the supercritical fluid.

Moreover, a gas sensor modified by the supercritical carbon dioxide doped with $H_2S$ is used as the gas sensor of group C1. Another gas sensor modified by the supercritical carbon dioxide doped with $NH_3$ is used as the gas sensor of group C2. A further gas sensor without modification is used as the gas sensor of group C0. A resistance of a gas ($R_{gas}$) is obtained by detecting the gas using the gas sensors of groups C0-C2. A resistance of air ($R_{air}$) is obtained by detecting air using the gas sensors of groups C0-C2. A sensor response is calculated by $R_{gas}$ minus $R_{air}$. The result is shown in FIG. 5, the gas sensor of group C1 which is modified by the supercritical carbon dioxide doped with $H_2S$ is more sensitive.

Accordingly, the method for reducing defects of an electronic component using a supercritical fluid according to the present invention can be used to modify the defects of the electronic components E, reducing the interfacial defects and the internal defects. The performance loss due to the defects can be further reduced (such as reducing power consumption, etc.). Therefore, by the method for reducing defects of an electronic component using a supercritical fluid according to the present invention, the efficiency of electrical conversion can be improved, and the performance of the electronic components can be enhanced.

Moreover, by the high penetrability and the high solubility, the supercritical fluid can effectively carry the reactant (that is, $H_2S$) to the electronic component. The grains of the electronic component can recrystallize and rearrange, reducing the interfacial defects and the internal defects, including, but not limited to, the porous silicon oxides, the dangling bond between atoms and molecules, the dislocation between different materials, insufficiency of element in specific material, and the atoms which do not meet the octet rule present in the electronic component.

In addition, the method can be carried out at a relative low temperature such as the temperature ranging from room temperature to 250° C. Thus, the method can be applied to reduce the defects of the third-generation semiconductor made of wide bandgap material such as SiC, GaN and AlGaN.

Although the invention has been described in detail with reference to its presently preferable embodiment, it will be understood by one of ordinary skill in the art that various modifications can be made without departing from the spirit and the scope of the invention, as set forth in the appended claims.

What is claimed is:

1. A method for reducing defects of an electronic component using a supercritical carbon dioxide fluid, comprising:

recrystallizing and rearranging grains in a material layer of the electronic component by introducing the supercritical carbon dioxide fluid doped with $H_2S$ together with an electromagnetic wave into a cavity having a temperature above a critical temperature of the supercritical carbon dioxide fluid and a pressure above a critical pressure of the supercritical carbon dioxide fluid;

wherein the electronic component is a gas sensor.

2. The method for reducing defects of the electronic component using the supercritical carbon dioxide fluid as claimed in claim 1, wherein the cavity has the temperature of 77-1000 K.

3. The method for reducing defects of the electronic component using the supercritical carbon dioxide fluid as claimed in claim 1, wherein the cavity has the pressure of 3-1000 atm.

* * * * *